(12) United States Patent
Bouisse

(10) Patent No.: US 11,811,366 B2
(45) Date of Patent: *Nov. 7, 2023

(54) SYMMETRICAL DOHERTY POWER AMPLIFIER HAVING IMPROVED EFFICIENCY

(71) Applicant: MACOM Technology Solutions Holdings, Inc., Lowell, MA (US)

(72) Inventor: Gerard Bouisse, Toulouse (FR)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/568,316

(22) Filed: Jan. 4, 2022

(65) Prior Publication Data

US 2022/0131503 A1 Apr. 28, 2022

Related U.S. Application Data

(63) Continuation of application No. 16/607,079, filed as application No. PCT/IB2017/000608 on Apr. 24, 2017, now Pat. No. 11,245,363.

(51) Int. Cl.
*H03F 1/07* (2006.01)
*H03F 1/02* (2006.01)
*H03F 3/21* (2006.01)

(52) U.S. Cl.
CPC ........... *H03F 1/0288* (2013.01); *H03F 3/211* (2013.01); *H03F 2200/387* (2013.01); *H03F 2200/451* (2013.01)

(58) Field of Classification Search
CPC ................................ H03F 1/07; H03F 1/0288
USPC .............................................. 330/124 R, 295
See application file for complete search history.

(56) References Cited

U.S. PATENT DOCUMENTS

| | | |
|---|---|---|
| 4,375,054 A | 2/1983 | Pavio |
| 6,085,074 A | 7/2000 | Cygan |
| 6,262,629 B1 | 7/2001 | Stengel et al. |
| 6,649,287 B2 | 11/2003 | Weeks et al. |
| 6,791,417 B2 | 9/2004 | Pengelly et al. |

(Continued)

FOREIGN PATENT DOCUMENTS

| | | |
|---|---|---|
| CN | 101494439 A | 7/2009 |
| CN | 102137518 A | 7/2011 |

(Continued)

OTHER PUBLICATIONS

International Search Report and Written Opinion for Application No. PCT/IB2017/000727 dated Oct. 19, 2017.

(Continued)

*Primary Examiner* — Henry Choe
(74) *Attorney, Agent, or Firm* — Perilla Knox & Hildebrandt LLP; Jason M. Perilla

(57) ABSTRACT

Apparatus and methods for an improved-efficiency Doherty amplifier are described. The Doherty amplifier may include a two-stage peaking amplifier that transitions from an "off" state to an "on" state later and more rapidly than a single-stage peaking amplifier used in a conventional Doherty amplifier. The improved Doherty amplifier may operate at higher gain values than a conventional Doherty amplifier, with no appreciable reduction in signal bandwidth.

20 Claims, 8 Drawing Sheets

(56) References Cited

U.S. PATENT DOCUMENTS

| | | |
|---|---|---|
| 7,078,976 B2 | 7/2006 | Blednov |
| 7,109,790 B2 | 9/2006 | Kwon et al. |
| 7,218,175 B1 | 5/2007 | Kobayashi |
| 7,414,478 B2 | 8/2008 | Elmala et al. |
| 7,541,866 B2 | 6/2009 | Bowles et al. |
| 7,602,241 B2 | 10/2009 | Suzuki et al. |
| 7,663,434 B2 | 2/2010 | Yang et al. |
| 7,876,159 B2 | 1/2011 | Wang et al. |
| 7,973,600 B2 | 7/2011 | Yu |
| 8,237,498 B2 | 8/2012 | Kato et al. |
| 8,358,174 B2 | 1/2013 | Kim et al. |
| 8,395,450 B2 | 3/2013 | Deguchi et al. |
| 8,466,746 B2 | 6/2013 | Jeong et al. |
| 8,487,703 B2 | 7/2013 | Blednov |
| 9,071,211 B1 | 6/2015 | Ozard |
| 9,083,284 B2 * | 7/2015 | Maslennikov ............ H03F 1/42 |
| 9,331,638 B2 | 5/2016 | Chen et al. |
| 9,531,329 B2 | 12/2016 | Tanimoto |
| 9,543,914 B2 | 1/2017 | Bouny |
| 9,621,115 B1 | 4/2017 | Wu |
| 9,667,199 B1 | 5/2017 | McLaren |
| 9,673,766 B1 | 6/2017 | Roberts et al. |
| 9,774,301 B1 | 9/2017 | Maalouf et al. |
| 9,813,036 B2 | 11/2017 | Folkmann et al. |
| 9,966,903 B1 | 5/2018 | McLaren et al. |
| 10,211,785 B2 | 2/2019 | McLaren |
| 10,284,146 B2 | 5/2019 | Wu et al. |
| 10,284,147 B2 | 5/2019 | Wu et al. |
| 10,305,437 B2 | 5/2019 | Ozard et al. |
| 11,018,629 B2 * | 5/2021 | Min ...................... H01L 23/528 |
| 11,050,389 B2 | 6/2021 | Cassou et al. |
| 11,159,125 B2 | 10/2021 | Bouisse et al. |
| 11,190,143 B2 | 11/2021 | Pham et al. |
| 11,233,483 B2 | 1/2022 | Bouisse et al. |
| 11,245,363 B2 * | 2/2022 | Bouisse .................. H03F 3/211 |
| 11,283,410 B2 | 3/2022 | Bouisse |
| 11,496,098 B2 | 11/2022 | Wang |
| 11,515,842 B2 * | 11/2022 | Wang ...................... H03F 3/195 |
| 11,522,499 B2 * | 12/2022 | Hue ........................ H01L 24/48 |
| 2003/0137346 A1 | 7/2003 | Hellberg |
| 2003/0141933 A1 | 7/2003 | Pengelly |
| 2005/0206462 A1 | 9/2005 | McCorquodale et al. |
| 2006/0097783 A1 | 5/2006 | Okubo et al. |
| 2006/0145757 A1 | 7/2006 | Kim et al. |
| 2007/0205827 A1 | 9/2007 | Mobbs |
| 2010/0315162 A1 | 12/2010 | Gajadharsing et al. |
| 2011/0140775 A1 | 6/2011 | Hong et al. |
| 2011/0193624 A1 | 8/2011 | Scott et al. |
| 2011/0204980 A1 | 8/2011 | Blednov |
| 2012/0025915 A1 | 2/2012 | Ui |
| 2012/0092074 A1 | 4/2012 | Yanduru et al. |
| 2012/0105147 A1 | 5/2012 | Harris et al. |
| 2012/0319780 A1 | 12/2012 | Wilson et al. |
| 2013/0093534 A1 | 4/2013 | Mei |
| 2013/0154729 A1 | 6/2013 | Folkmann et al. |
| 2014/0118070 A1 | 5/2014 | Wilson et al. |
| 2014/0132343 A1 | 5/2014 | Colantonio et al. |
| 2014/0146917 A1 | 5/2014 | Muhammad |
| 2014/0218116 A1 | 8/2014 | Cui et al. |
| 2015/0002227 A1 | 1/2015 | Pribble et al. |
| 2015/0002230 A1 | 1/2015 | Qureshi |
| 2015/0091651 A1 | 4/2015 | Seneviratne et al. |
| 2015/0155838 A1 | 6/2015 | Embar et al. |
| 2015/0180428 A1 | 6/2015 | Pham et al. |
| 2016/0036398 A1 | 2/2016 | Li |
| 2016/0268976 A1 | 9/2016 | Negra et al. |
| 2016/0336903 A1 | 11/2016 | Ahmed et al. |
| 2017/0016322 A1 | 1/2017 | Hagenbuch |
| 2017/0019071 A1 | 1/2017 | Kobayashi et al. |
| 2017/0070193 A1 | 3/2017 | Juang et al. |
| 2017/0085228 A1 | 3/2017 | Adbo et al. |
| 2017/0163221 A1 | 6/2017 | Takagi et al. |
| 2018/0026583 A1 | 1/2018 | Yanduru et al. |
| 2018/0034418 A1 | 2/2018 | Blednov |
| 2018/0034419 A1 | 2/2018 | Moronval |
| 2018/0183388 A1 | 6/2018 | Pham |
| 2018/0191309 A1 | 7/2018 | McLaren |
| 2018/0233578 A1 | 8/2018 | Shi et al. |
| 2018/0248521 A1 | 8/2018 | Min et al. |
| 2018/0254748 A1 | 9/2018 | Grebennikov et al. |
| 2019/0027442 A1 | 1/2019 | Ercoli |
| 2019/0036487 A1 | 1/2019 | Jiang |
| 2019/0333878 A1 | 10/2019 | Wu et al. |
| 2019/0356277 A1 | 11/2019 | Bouisse et al. |
| 2020/0212847 A1 | 7/2020 | Pham et al. |
| 2021/0013572 A1 | 1/2021 | Zhu |
| 2021/0013836 A1 | 1/2021 | Bouisse et al. |
| 2021/0194443 A1 * | 6/2021 | Maalouf ............... H03F 1/0288 |
| 2022/0085772 A1 | 3/2022 | Holmes et al. |
| 2022/0123693 A1 | 4/2022 | Wang et al. |
| 2022/0416725 A1 * | 12/2022 | van der Heijden ....... H03F 3/24 |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104747747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 A1 | 4/2012 |
| EP | 2458730 A1 | 5/2012 |
| EP | 2698918 A1 | 2/2014 |
| EP | 2806557 A1 | 11/2014 |
| EP | 2876810 A1 | 5/2015 |
| EP | 3121960 A1 | 1/2017 |
| EP | 3133735 A1 | 2/2017 |
| EP | 3179628 A2 | 6/2017 |
| EP | 3179638 A1 | 6/2017 |
| EP | 3054589 B1 | 7/2018 |
| JP | 2012222624 A | 11/2012 |
| TW | I336996 B | 2/2011 |
| TW | I377783 B | 11/2012 |
| TW | I462469 B | 11/2014 |
| TW | 201611514 A | 3/2016 |
| WO | 2009027916 A2 | 3/2009 |
| WO | 2015176077 A2 | 11/2015 |
| WO | 2017192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |
| WO | 2018197918 A1 | 11/2018 |
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

International Search Report and Written Opinion for Application No. PCT/IB2017/000608 dated Sep. 8, 2017.
International Preliminary Report on Patentability for International Application No. PCT/IB2017/000608, dated Oct. 29, 2019.
International Search Report and Written Opinion for Application No. PCT/IB2017/000717 dated Dec. 6, 2017.
International Preliminary Report on Patentability for International Application No. PCT/IB2017/000717, dated Aug. 6, 2019.
International Search Report and Written Opinion for Application No. PCT/IB2017/000722 dated Nov. 7, 2017.
International Preliminary Report on Patentability for International Application No. PCT/IB2017/000722, dated Aug. 6, 2019.
International Search Report and Written Opinion for Application No. PCT/US2017/068164 dated Mar. 13, 2018.
International Preliminary Report on Patentability for International Application No. PCT/US2017/068164 dated Apr. 3, 2019.

(56) References Cited

OTHER PUBLICATIONS

Office Action from European Application No. 17726354.8 dated May 27, 2021.
International Search Report and Written Opinion for Application No. PCT/IB2018/046754 dated Nov. 22, 2018.
International Search Report and Written Opinion for Application No. PCT/IB2017/001575 dated Jun. 18, 2018.
International Search Report and Written Opinion for Application No. PCT/IB2017/000639 dated Sep. 8, 2017.
International Preliminary Report on Patentability for International Application No. PCT/IB2017/000639, dated Oct. 29, 2019.
International Search Report and Written Opinion for Application No. PCT/IB2017/000604 dated Sep. 8, 2017.
International Preliminary Report on Patentability for International Application No. PCT/IB2017/000604 dated Oct. 29, 2019.
International Search Report and Written Opinion for International Application No. PCT/US2019/054686, dated Dec. 19, 2019.
Camarchia et al., 7 GHz MMIC GaN Doherty Power Amplifier With 47% Efficiency at 7 dB Output Back-Off. IEEE Microwave and Wireless Components Letters. Jan. 2013; 23(1):34-6.
Campbell, A Fully Integrated Ku-Band Doherty Amplifier MMIC. IEEE Microwave and Guided Wave Letters. Mar. 1999; 9(3):114-6.
Cidronali et al., Frequency Analysis and Multiline Implementation of Compensated Impedance Inverter for Wideband Doherty High-Power Amplifier Design. IEEE Transactions on Microwave Theory and Techniques. May 2016;64(5):1359-72.
Grebennikov et al., High-Efficiency Doherty Power Amplifiers: Historical Aspect and Modem Trends. Proceedings of the IEEE. Dec. 2012; I00(12):3190-219.
Kim et al., Doherty Linear Power Amplifiers for Mobile Handset Applications. Proceedings of Asia-Pacific Microwave Conference. Dec. 2006;1885-94.
Merrick et al., A wideband sequential power amplifier. 2014 IEEE MTT-S International Microwave Symposium (IMS2014). Jun. 1, 2014:1-3.
Moronval et al., A 100 W Multi-Band Four-Way Integrated Doherty Amplifier. IEEE MTT-S International Microwave Symposium (IMS) May 22, 2016:1-3.
Quaglia et al., K-Band GaAs MMIC Doherty Power Amplifier for Microwave Radio With Optimized Driver. IEEE Transactions on Microwave Theory and Techniques. Nov. 2014;62(11):2518-25.
Roberts, Understanding the 3 Level Doherty. 11th European Microwave Integrated Circuits Conference (EUMIC), European Microwave Association. Oct. 3, 2016:428-32.
Wicks et al., A 60-GHz Fully-Integrated Doherty Power Amplifier Based on 0.13-μm CMOS Process. Radio Frequency Integrated Circuits Symposium. Jun. 2008 I 7;69-72.
Yu et al., Fully Integrated Doherty Power Amplifiers for 5 GHz Wireless-LANs. IEEE Radio Frequency Integrated Circuits Symposium (RFIC). Jun. 11, 2006;153-6.
Zhou et al., Design of an S-Band Two-Way Inverted Asymmetrical Doherty Power Amplifier for Long Term Evolution Applications. Progress in Electromagnetics Research Letters. Apr. 2013;39:73-80.
Andrei Grebennikov, "A high-efficiency 100-W four-stage Doherty GaN H EMT power amplifier module for WCDMA systems", 2011 IEEE MTT-S International Microwave Symposium (Year: 2011).
Non-Final Office Action for U.S. Appl. No. 16/607,079 dated Feb. 8, 2021.
International Preliminary Report on Patentability for International Application No. PCT/IB2018/046754 dated Feb. 27, 2020.
Final Office Action for U.S. Appl. No. 16/607,079 dated Jun. 28, 2021.
Andrei Grebennikov, "A high-efficiency 100-W four-stage Doherty GaN HEMT power amplifier module for WCDMA systems", 2011 IEEE MTT-S International Microwave Symposium.
Barthwal Ayushi et al, "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, ISSN 0018-9480, Feb. 2018.
Ceylan et al, "Refine Biasing Networks for High PA Low Frequency Stability," Microwave & RF, Apr. 17, 2018, pp. 1-6.
Daehyun Kang et al, "30.3% PAE HBT Doherty power amplifier for 2.5-2.7 GHz mobile WiMAX," Microwave Symposium Digest (MTT), 2010 IEEE MTT-S International, IEEE, Piscataway, NJ, USA, Piscataway, NJ, USA , (May 23, 2010), ISBN 978-1-4244-6056-4, pp. 796-799.
Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.
Daniel Popp et al, "High Power and High Bandwidth Digital Three-Way Doherty Power Amplifier", 2019 IEEE 20th Wireless and Microwave Technology Conference (WAMICON), IEEE, (Apr. 8, 2019), doi:10.1109/WAMICON.2019.8765455, pp. 1-6, XP033577671.
International Search Report and Written Opinion in Application No. PCT/US2020/060158, dated Mar. 10, 2021.
Office Action for European Application No. 17825920.6 dated Dec. 1, 2021.
Office Action for Taiwanese Application No. 107113817 dated Oct. 6, 2021, with Translation.
Office Action from European Application No. 17728258.9 dated May 27, 2021.
Office Action from European Application No. 17732555.2 dated Aug. 11, 2021.
Office Action from European Application No. 17734137.7 dated Aug. 9, 2021.
Office Action in CN Application No. 201780092425.1, dated Jan. 10, 2023, With Summary.
Office Action in CN Patent Application No. 2017800924285, dated Dec. 23, 2022, with Translation.
Office Action in EP 17726356.3, dated May 20, 2021.
Office Action in EP 18759225.8, dated Oct. 27, 2021.
Office Action in TW Application No. 107103816, with Search Report, dated Feb. 25, 2021, with Translation.
Office Action in TW Application No. 107103822, with Search Report, dated Feb. 24, 2021, with Translation.
Office Action in TW Patent Application No. 107113817 dated Jan. 21, 2021, with Translation.
Search Report for Taiwanese Application No. 107113802 dated May 26, 2021.
Translation of Office Action in TW Patent Application No. 107103832, with Search Report dated Feb. 25, 2021.
Vigneau et al, "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.
Xia Jing et al, "Improved Three-Stage Doherty Amplifier Design With Impedance Compensation in Load Combiner for Broadband Applications", IEEE Transactions on Microwave Theory and Techniques, Plenum, USA, vol. 67, No. 2, doi:10.1109/TMTT.2018.2884404, ISSN 0018-9480, (Feb. 1, 2019), pp. 778-786.
Cheng et al, "GaN HEMT Based Doherty Broadband Power Amplifier," Journal of Hangzhou Dianzi University (Natural Sciences), Mar. 15, 2017.
Summons to Attend Oral Proceedings in European Application No. 17726356.3 dated Feb. 22, 2023.
Office Action in CN Patent Application No. 2017800924285, dated Jun. 15, 2023, with Translation.
Decision to Refuse for European Application No. 17726356.3 dated Jul. 13, 2023.

* cited by examiner

SYMMETRICAL DOHERTY POWER AMPLIFIER HAVING IMPROVED EFFICIENCY

CROSS REFERENCE TO RELATED APPLICATIONS

This application is a continuation of U.S. Non-Provisional application Ser. No. 16/607,079, filed Oct. 21, 2019, and titled "IMPROVED EFFICIENCY, SYMMETRICAL DOHERTY POWER AMPLIFIER," which is the 35 U.S.C. § 371 National Stage Application of PCT Application No. PCT/IB2017/000608, filed Apr. 24, 2017, the entire contents of both of which applications are hereby incorporated herein by reference.

BACKGROUND

Technical Field

The technology relates to high-speed, high-power, integrated amplifiers which may be constructed from gallium nitride transistors or transistors formed from other semiconductor materials.

Discussion of the Related Art

Gallium nitride (GaN) semiconductor material has received appreciable attention in recent years because of its desirable electronic and electro-optical properties. GaN has a wide, direct bandgap of about 3.4 eV that corresponds to the blue wavelength region of the visible spectrum. Light-emitting diodes (LEDs) and laser diodes (LDs) based on GaN and its alloys have been developed and are commercially available. These devices can emit visible light ranging from the violet to red regions of the visible spectrum.

Because of its wide bandgap, GaN is more resistant to avalanche breakdown and can maintain electrical performance at higher temperatures than other semiconductors, such as silicon. GaN also has a higher carrier saturation velocity compared to silicon. Additionally, GaN has a Wurtzite crystal structure, is a very stable and hard material, has a high thermal conductivity, and has a much higher melting point than other conventional semiconductors such as silicon, germanium, and gallium arsenide. Accordingly, GaN is useful for high-speed, high-voltage, and high-power applications. For example, gallium-nitride materials are useful in semiconductor amplifiers for radio-frequency (RF) communications, radar, RF energy, and microwave applications.

Applications supporting mobile communications and wireless internet access under current and proposed communication standards, such as WiMax, 4G, and 5G, can place austere performance demands on high-speed or RF amplifiers constructed from semiconductor transistors. The amplifiers may need to meet performance specifications related to output power, signal linearity, signal gain, bandwidth, and efficiency. One approach to amplifying signals for communications is to use a Doherty amplifier, which is depicted schematically in FIG. 1. To aid in understanding the present technology, a brief summary of conventional Doherty amplification is provided.

A conventional Doherty amplifier 100 comprises a 90-degree power splitter 110, which divides a received RF signal into two outputs that connect to a main amplifier 132 and a peaking amplifier 138 arranged on parallel circuit branches. The power splitter 110 also delays (by approximately 90 degrees) the phase of the signal provided to the peaking amplifier with respect to the phase of the signal provided to the main amplifier. Impedance-matching components 122, 124 are placed before the main amplifier 132 and peaking amplifier 138. These impedance-matching components transform impedance to match the impedances of the transmission lines from the 90-degree splitter 110 to the input impedances of the two amplifiers 132, 138, so that signal reflections from the amplifiers are reduced. Additional impedance-matching components 142, 144 are placed at the outputs of the main and peaking amplifiers to match impedances between the output of the main amplifier 132 to the input of an impedance inverter 150 (which may be 50 ohms by design) and between the output of the peaking amplifier 138 and the combining node 155. The impedance inverter 150 rotates the phase of the signal received from the main amplifier 132 so that the signals from the main amplifier and peaking amplifier will be essentially in phase at the combining node 155. Typically, an output impedance-matching element 160 connects to the combining node 155 to match the output impedance of the Doherty amplifier to an impedance of a load (not shown).

In a symmetric Doherty amplifier, the main amplifier and peaking amplifier may be closely similar or identical semiconductor devices. For example, they may be configured to handle a same amount of signal power and amplify a signal by a same amount. Because the input power is split equally, the signal to the main amplifier 132 is typically attenuated by 3 dB compared to the input RF signal. Signal values expressed in "dB" refer to relative power levels.

Operational aspects of a conventional Doherty amplifier are illustrated in the plots of FIG. 2 through FIG. 4. A first gain curve 210 depicts gain of the main amplifier 132 as a function of output power when the peaking amplifier 138 is off. The peaking amplifier is typically off at low power levels, which can be handled by the main amplifier only. At high power levels, the gain of the main amplifier will go into "compression," which begins at a power compression point $P_c$ and is indicated by the fall-off region 212 in FIG. 2. The power compression point for a main amplifier will depend upon its design (e.g., the size of active areas in the amplifier's transistors), and could be any value from 1 Watt to 100 Watts. A second gain curve 220 depicts gain of the main amplifier 132 as a function of output power when the peaking amplifier 138 is on. When the peaking amplifier is on, it effectively adds load impedance to the main amplifier 132 (reducing gain of the main amplifier) but also assists in amplifying high power levels (extending the Doherty's compression to higher powers). A third gain curve 230 depicts gain of the peaking amplifier 138. In a conventional Doherty amplifier 100, the main amplifier 132 handles signal amplification until its gain begins to compress. The peaking amplifier 138 is configured to begin low levels of amplification at the power compression point of the main amplifier and then increase its gain to a maximum. The increase in gain of the peaking amplifier 138 is approximately linear until the peaking amplifier enters compression and falls off with the main amplifier 132 in a symmetrical Doherty amplifier.

FIG. 3 depicts a Doherty gain curve 310 (solid dark curve) as a function of output power for a conventional Doherty amplifier. The Doherty gain curve 310 is a result of the combined actions of the main amplifier 132 and peaking amplifier 138 as described above. A resulting efficiency curve 410 for a conventional Doherty amplifier is illustrated in FIG. 4. The efficiency of the Doherty rises to a peak efficiency $E_p$ that occurs approximately when the gain of the peaking amplifier 138 has reached its highest value. The peak efficiency $E_p$ typically occurs at about 6 dB below the maximum output power $P_{max}$, in a region referred to as "output power back-off" (OPO). The efficiency falls below the peak value $E_p$ for output power levels less than 6 dB OPO in a region where the peaking amplifier is transitioning from low gain levels (where the peaking amplifier primarily loads the main amplifier) to its maximum gain.

SUMMARY

Methods and structures for improving the efficiency and gain performance of symmetric Doherty amplifiers are described. A two-stage amplifier may be used as a peaking amplifier in a Doherty amplifier, and an RF coupler may be used to provide an input RF signal to the main and two-stage amplifiers in the Doherty. The two-stage peaking amplifier can improve back-off efficiency and gain performance of the Doherty amplifier. Also, the two-stage peaking amplifier arrangement does not appreciably affect the bandwidth performance of the Doherty amplifier.

Some embodiments relate to a Doherty amplifier comprising an RF coupler, a main amplifier coupled to a first port of the RF coupler, a two-stage peaking amplifier coupled to a second port of the RF coupler, and a combining node coupled to an output port from the main amplifier and an output port from the two-stage peaking amplifier.

In some aspects, the two-stage peaking amplifier comprises two cascaded amplifiers of a same design. The two cascaded amplifiers may be of a same design as the main amplifier. In some cases, the two cascaded amplifiers comprise gallium-nitride amplifiers. According to some implementations, each of the two cascaded amplifiers have a gain value between 20 dB and 30 dB. In some implementations, each of the two cascaded amplifiers have a gain value between 16 dB and 30 dB. In some cases, a gain value for each of the two cascaded amplifiers is the same to within 3 dB.

In some implementations, the RF coupler of a Doherty amplifier of the present embodiments is configured to divide a received RF signal into a first signal for the main amplifier and a second signal for the two-stage peaking amplifier, wherein the first signal has at least twice as much power as the second signal. In some cases, a difference between the first signal and second signal is between 10 dB and 50 dB.

According to some aspects, a Doherty amplifier may further comprise a component coupled to the main amplifier that compensates for a signal delay associated with one amplifier of the two-stage peaking amplifier. The compensating component may comprise an impedance-matching component or delay component having one or more discrete and/or integrated inductors, for example.

In some cases, the combining node may be located at a drain pad of a second peaking amplifier of the two-stage peaking amplifier. In some aspects, there may be no impedance-matching elements between an output of the main amplifier and the combining node that match an impedance to 50 Ohms or approximately 50 Ohms.

According to some implementations, a Doherty amplifier of the present embodiments may be incorporated into a smart phone or cell phone or base station for amplifying communication signals. In some cases, a Doherty amplifier according to the present embodiments is configured to amplify signals having carrier frequencies between 1.8 gigahertz and 7 gigahertz.

Methods for operating Doherty amplifiers having improved efficiency are also contemplated. A method of amplifying signals with a Doherty amplifier may comprise acts of receiving, at a coupler, a signal; dividing the signal with the coupler into a first signal and a second signal; providing the first signal to a main amplifier in a first circuit branch; amplifying the first signal with the main amplifier; providing the second signal to a first peaking amplifier and a second peaking amplifier that are cascaded in a second circuit branch; amplifying the second signal with the first peaking amplifier and second peaking amplifier; and combining a first output signal from the main amplifier with a second output signal from the cascaded first peaking amplifier and second peaking amplifier. A method may further include compensating, in the first circuit branch, for a signal delay introduced by the second peaking amplifier.

In some implementations, dividing the signal may comprise providing at least twice as much power to the first signal than to the second signal. In some cases, dividing the signal may comprise producing the second signal to have between 10 dB and 50 dB less power than the first signal. According to some aspects, dividing the signal may comprise delaying the second signal with respect to the first signal.

In some aspects, amplifying the second signal may comprise acts of amplifying the second signal by a first amount with the first peaking amplifier; and amplifying an output from the first peaking amplifier by a second amount with the second peaking amplifier, wherein the first amount and the second amount are between 20 dB and 30 dB. According to some implementations, the first amount and the second amount may be the same amount to within 3 dB. In some implementations, combining the first output signal with the second output signal may comprise providing the first output signal to a drain pad of the second peaking amplifier. In some cases, combining the first output signal with the second output signal may comprise not matching impedances of the first output signal and second output signal to 50 Ohms or approximately 50 Ohms before combining the two signals.

A method of amplifying signals with a Doherty amplifier of the present embodiments may further include providing an output from the Doherty amplifier to an antenna of a wireless device to transmit a signal wirelessly. The amplified signals may have a carrier frequency between 1.8 gigahertz and 7 gigahertz.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

In overview, the present embodiments relate to improving the output power back-off (OBO) efficiency and gain of Doherty power amplifiers. In some implementations, a two-stage peaking amplifier is incorporated into a Doherty amplifier. The two-stage peaking amplifier is configured to turn on later than a single-stage peaking amplifier of a conventional Doherty amplifier, but have a faster rise in gain compared to a conventional Doherty peaking amplifier. The combined actions of the two-stage peaking amplifier and main amplifier provide higher OBO efficiency for the Doherty amplifier, without an appreciable reduction in bandwidth capability of the Doherty amplifier. Additionally, the inclusion of the two-stage peaking amplifier enables the Doherty amplifier to operate with higher gain values.

The inventor has recognized and appreciated that several approaches to improving Doherty power back-off efficiency have been pursued. One approach is to use an asymmetrical Doherty amplifier configuration, in which the peaking amplifier 138 has a larger power-handling capability than the main amplifier 132. Another approach is to assemble a "multi-way" Doherty amplifier, in which two or more amplifiers connected in parallel may be used as an effective peaking amplifier. The inventor has further recognized and appreciated that both these approaches to improving a Doherty amplifier's power back-off efficiency incurs a cost in bandwidth performance of the Doherty amplifier. For example, either approach reduces both the RF bandwidth and modulation signal bandwidth (sometimes referred to as "instantaneous bandwidth" or "video bandwidth") that the Doherty amplifier can support, and such a reduction in bandwidth performance may be undesirable for broad-band communication systems.

Figure 5:
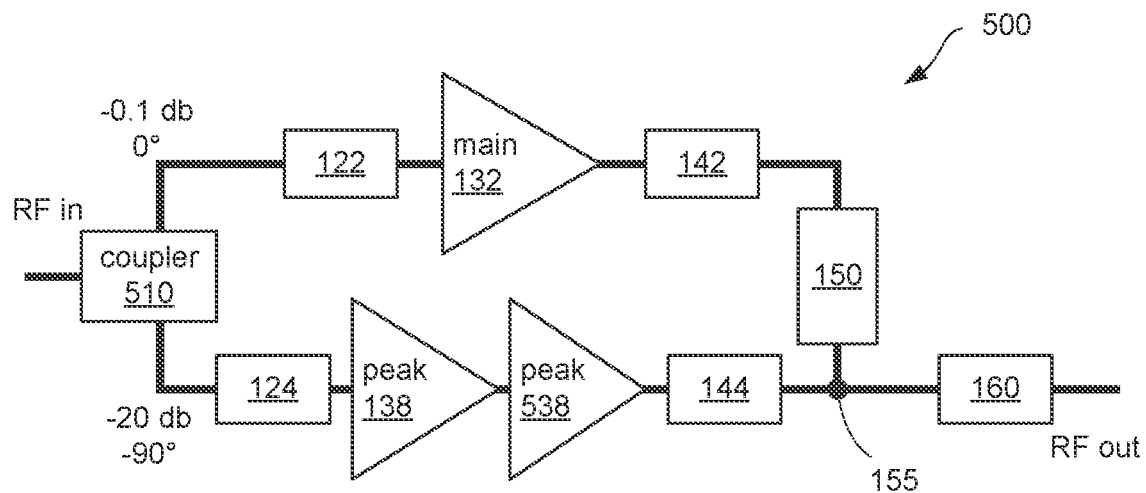
FIG. 5 depicts an improved-efficiency Doherty amplifier, according to some embodiments.

According to some embodiments, a Doherty amplifier may be modified to include a second peaking amplifier 538 in the peaking-amplifier circuit branch, as depicted in FIG. 5. The second peaking amplifier 538 may be of the same design as the first peaking amplifier 138, and of the same design as the main amplifier 132. The term "same design" means that the amplifiers are nearly identical or identical for all intents and purposes. For example, the amplifiers may be formed as integrated power transistors using a same micro-fabrication process, though there may be slight variations in structure due to the nature of the microfabrication process. Both the first peaking amplifier 138 and second peaking amplifier 538 may be operated as class-C amplifiers. In some embodiments, the first peaking amplifier 138 and second peaking amplifier 538, as well as the main amplifier 132, may comprise gallium-nitride transistors. In other embodiments, other semiconductor materials may be used, such as gallium-arsenide or silicon-germanium, and the invention is not limited to only these semiconductors. An example of a power amplifier comprising semiconductor material that may be used for the main amplifier 132 and/or peaking amplifiers 138, 538 is described in U.S. patent application Ser. No. 14/878,952 filed Oct. 8, 2015, titled "Tuned Semiconductor Amplifier," which application is incorporated herein by reference in its entirety, however the invention is not limited to only this type of amplifier. The modified Doherty amplifier may be configured to amplify signals having a carrier frequency between 1 gigahertz (GHz) and 8 GHz, according to some embodiments, or between 1.6 GHz and 7 GHz, according to some embodiments. In some implementations, a modified Doherty amplifier may be configured to amplify signals having a carrier frequency between 1.8 GHz and 7 GHz.

In some implementations, the gain values of the first peaking amplifier 138 and second peaking amplifier 538 may be between 20 dB and 30 dB. In some cases, the gain values of the first peaking amplifier 138 and second peaking amplifier 538 may be between 16 dB and 30 dB. In some implementations, the gain values of the first peaking amplifier 138 and second peaking amplifier 538 may be between 20 dB and 30 dB. In some cases, the gain values of the two amplifiers may be the same to within 3 dB. The gain of the main amplifier 132 may be in the same range of gain values, and also may be the same as the first peaking amplifier 138 and second peaking amplifier 538 to within 3 dB.

Figure 6:
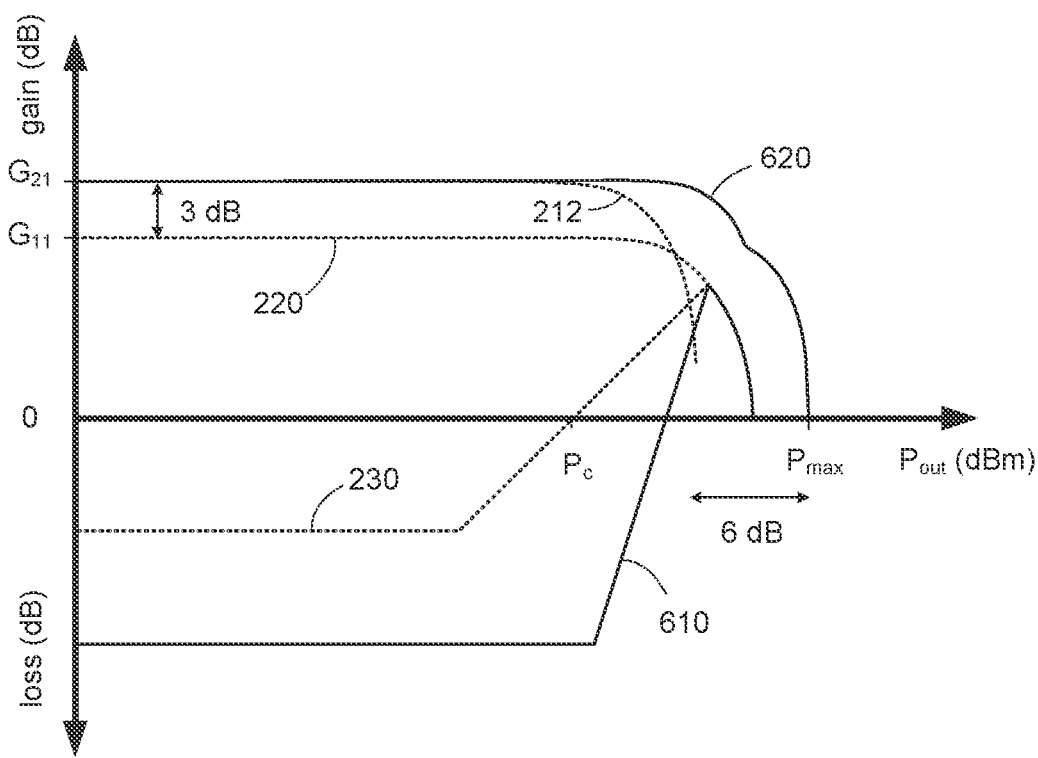
FIG. 6 illustrates gain characteristics of main and peaking amplifiers in an improved-efficiency Doherty amplifier, according to some embodiments.

In some embodiments, the biasing of the first peaking amplifier 138 and second peaking amplifier are different from the biasing of a single peaking amplifier in a conventional Doherty amplifier. For example, gates of the first peaking amplifier 138 and second peaking amplifier 538 of an improved-efficiency Doherty amplifier 500 may be set so that the pair of peaking amplifiers turns on later, at higher power levels, as illustrated by the combined peaking-amplifier gain curve 610 in FIG. 6, as compared to the single peaking-amplifier gain curve 230 of a conventional Doherty amplifier. In some cases, the gate biasing of the two peaking amplifiers 138, 538 may be different from the gate biasing of the main amplifier 132. In some implementations, the first peaking amplifier 138 may turn on before the second peaking amplifier 538.

Figure 7:
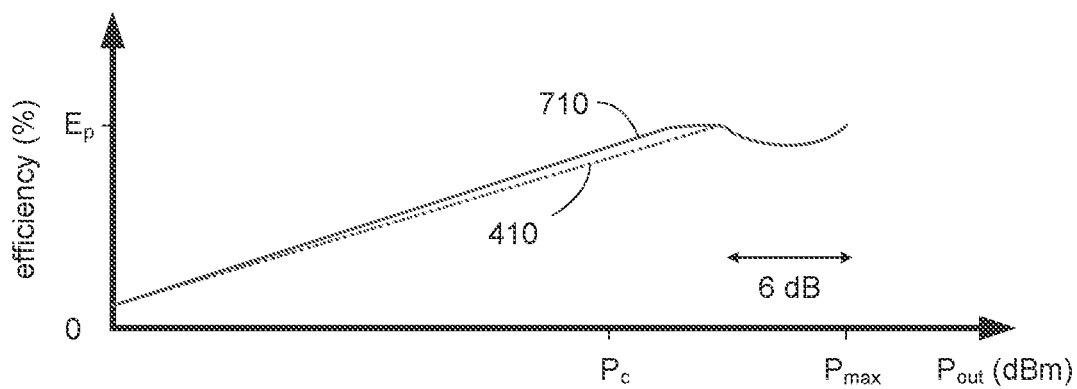
FIG. 7 illustrates improvements in efficiency for a Doherty amplifier, according to some embodiments.

Because the gain of the combined first and second peaking amplifiers is higher than for a single-stage peaking amplifier, the gain of the combined peaking amplifiers rises more steeply (as compared to gain curve 230 for a single-stage peaking amplifier of a conventional Doherty amplifier). This allows the cascaded peaking amplifiers to transition from an "off" state to an "on" state closer to the power compression point $P_c$ of the main amplifier 132. In some implementations, the transition begins within 6 dB of the power compression point $P_c$. By delaying the transition of the peaking amplifiers from low gain to high gain, adverse effects on amplifier efficiency in a deep-OPO region (below about 6 dB OPO) can be reduced. The result is an improvement in Doherty efficiency in the deep-OPO region. An improved efficiency curve 710 is depicted in FIG. 7. In some embodiments, an improvement to deep-OPO efficiency may be between 2% and 10%. Because the amplifiers may be used in battery-powered mobile devices, such improvements in amplifier efficiency can reduce power consumption and extend operation of the devices between battery recharging.

Figure 1:
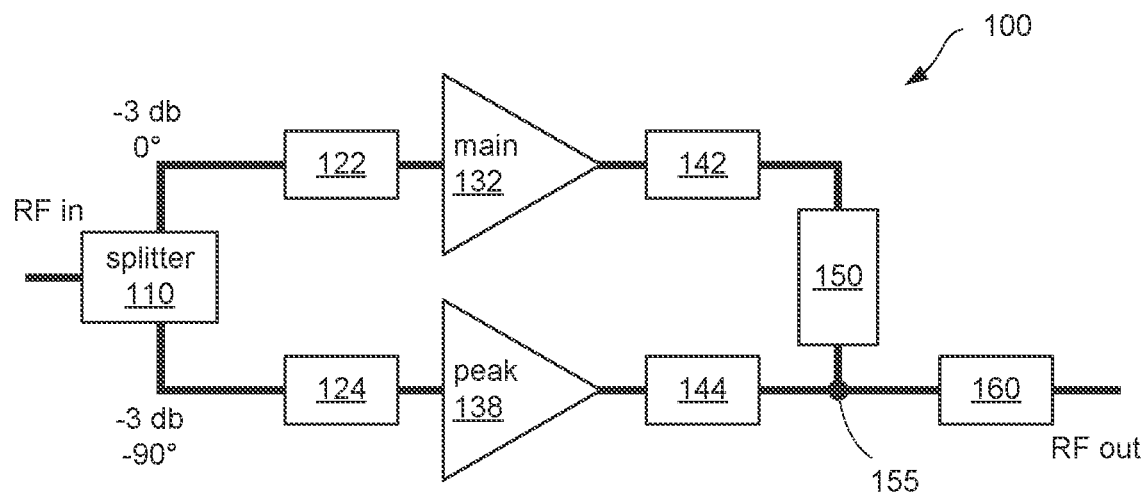
FIG. 1 depicts a first arrangement of a conventional Doherty amplifier.
Figure 2:
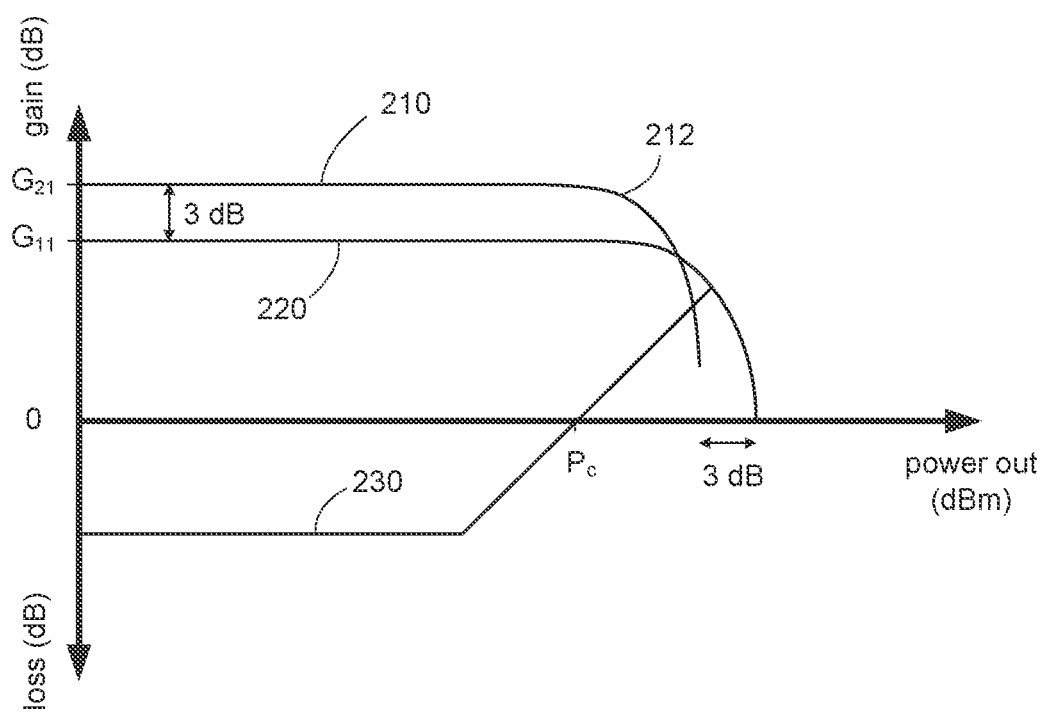
FIG. 2 illustrates gain characteristics of main and peaking amplifiers in a Doherty amplifier.
Figure 3:
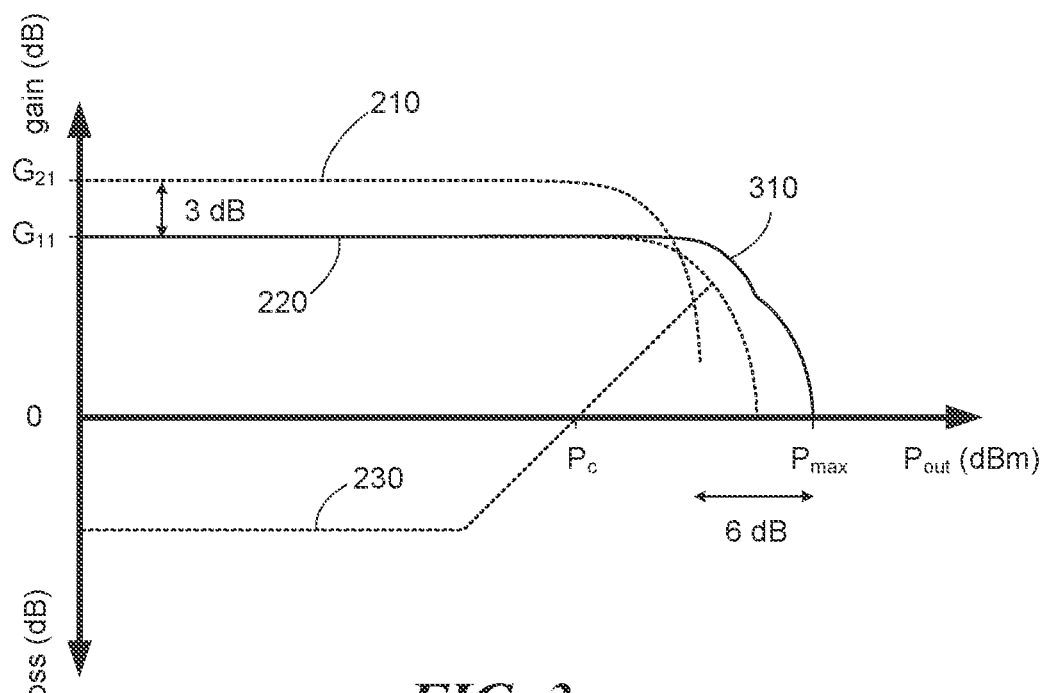
FIG. 3 illustrates gain as a function of output power for a conventional Doherty amplifier.
Figure 4:
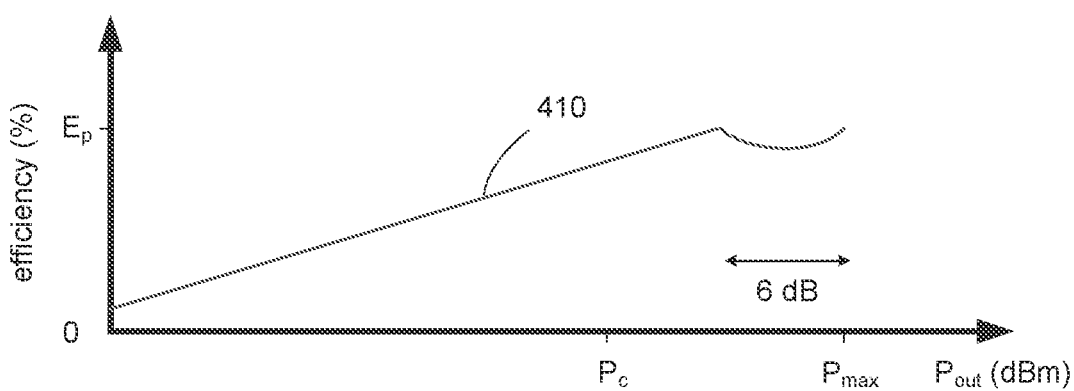
FIG. 4 illustrates efficiency of a conventional Doherty amplifier as a function of output power.

An additional benefit in using a two-stage peaking amplifier 138, 538 is that the input splitter can be replaced with a coupler 510 that provides most of the RF input signal to the main amplifier 132 and a small portion to the peaking amplifiers. For example and referring again to FIG. 5, in some embodiments the coupler 510 may comprise a 20 dB coupler that outputs most of the RF signal to the main amplifier 132 and provides a small fraction ($\sim 1/100^{th}$) of the signal to the peaking amplifiers 138, 538. The higher gain from the cascaded peaking amplifiers can compensate for the imbalance in power from the coupler 510. Accordingly, approximately a 3 dB increase in signal strength is provided to the main amplifier 132 compared to a conventional Doherty amplifier configuration. This increase in signal strength translates into a higher Doherty gain by approximately 3 dB for the Doherty amplifier. The improvement in Doherty gain can be seen by comparing the improved-efficiency Doherty gain curve 620 of FIG. 6 with the conventional Doherty gain curve 310 of FIG. 3. In some implementations, couplers having different power-splitting values may be used (e.g., 6 dB, 10 dB, 12 dB, 30 dB, 50 dB, etc.) and the embodiments are not limited to 20 dB couplers. Other power-splitting values may change the improvements in efficiency and gain for the Doherty amplifier.

According to some embodiments, the second peaking amplifier 538 may add signal delay to the peaking amplifier circuit branch. According to some embodiments, the added delay may be compensated in the input impedance-matching component 122 located in the main amplifier circuit branch or by another impedance-matching or delay component in the main amplifier circuit branch. An impedance-matching component or delay component may comprise one or more passive components connected in the main amplifier circuit branch. Examples of passive components include, but are not limited to, inductors, capacitors, resistors, bond wires, and transmission lines. Some or all of the passive components may be discrete components mounted on a substrate that includes the Doherty amplifier, or may be integrated components formed on the substrate (e.g., patterned a formed on the substrate using microfabrication processes). The passive components may be selected and connected in a network to provide a desired impedance transformation and/or phase delay using conventional analytical techniques.

In some implementations, an additional delay component or impedance-matching component that adds additional delay to compensate for the second peaking amplifier 538 may not be added to the main amplifier circuit branch. Instead, less delay may be added to the peaking amplifier circuit branch by the coupler 510. For example, if the second peaking amplifier 538 adds −10 degrees of phase delay, then the coupler 510 may be configured to add a delay of −80 degrees instead of −90 degrees. Other delay amounts may be present in other embodiments, and the delay depicted for the coupler 510 in FIG. 5 is only one example value.

According to some embodiments, improving the Doherty's efficiency by the addition of a second peaking amplifier 538 does not adversely affect the bandwidth capability of the Doherty amplifier as much as other alternatives (such as an asymmetric Doherty or multi-way Doherty) would affect the bandwidth performance. For example, the RF bandwidth (relating to the range of carrier signals that can be handled by the Doherty) is essentially unaffected for a Doherty amplifier that is modified to include a two-stage peaking amplifier. This is because the RF bandwidth is determined primarily by impedance matching at the output of the main and peaking amplifiers, and this impedance matching is essentially unchanged between the conventional Doherty and the improved-efficiency Doherty 500 with a two-stage peaking amplifier. To first order, the video bandwidth (relating to the highest speed at which the carrier signal can be modulated) is also essentially unchanged (e.g., less than 5% change).

In contrast, the inventor has recognized that implementing an asymmetric Doherty or multi-way Doherty would significantly impact bandwidth performance. For example, a conventional Doherty amplifier having an RF bandwidth from 2.5 gigahertz to 2.7 gigahertz (about 200 MHz RF bandwidth) has a video bandwidth of approximately 150 MHz. An asymmetrical version of the Doherty amplifier where the peaking amplifier has twice the power capability of the main amplifier experiences a reduction in RF bandwidth to about 65 MHz and a reduction in video bandwidth to about 48 MHz. Similar reductions occur for multi-way Doherty amplifiers. Such large bandwidth reductions (over 60% in this example) may be avoided by implementing a two-stage peaking amplifier, according to the present embodiments.

An improved-efficiency Doherty amplifier 500 may be implemented in a variety of packages. According to some embodiments, an improved-efficiency Doherty amplifier 500 may be assembled on a printed-circuit board or application board using discrete components. In some embodiments, an improved-efficiency Doherty amplifier 500 may be fabricated in a monolithic microwave integrated circuit (MMIC) process. For example, the main and peaking amplifiers may each be fabricated as one or more integrated, semiconductor transistors that are mounted on a PCB or MMIC. The coupler, delay elements, and impedance-matching elements may be formed as discrete or integrated components, or a combination thereof.

A packaged, improved-efficiency Doherty amplifier 500 may be incorporated into a cell phone or base station amplification system and used for amplifying wireless communication signals, according to some embodiments. A packaged, improved-efficiency Doherty amplifier 500 may be incorporated into any device that has wireless access capability including, but not limited to, computers, tablets, smart phones, smart watches, vehicles, smart appliances, etc. Advantages of an improved-efficiency Doherty amplifier 500 for portable devices include its increased efficiency and higher gain capability compared to conventional Doherty amplifiers. The increased efficiency can contribute to prolonged battery life in a portable device. The higher gain can improve signal quality for communications.

Methods of operating an improved-efficiency Doherty amplifier are also contemplated. A method of operating an improved-efficiency Doherty amplifier may include a combination of acts such as, but not limited to, receiving, at a coupler, a signal (e.g., an RF signal which may be modulated to include data for transmitting), and dividing the signal with the coupler into a first signal and a second signal. A method may further include providing the first signal to a main amplifier in a first circuit branch, amplifying the first signal with the main amplifier, providing the second signal to a first peaking amplifier and a second peaking amplifier that are cascaded in a second circuit branch, and amplifying the second signal with the first peaking amplifier and second peaking amplifier. A method may also include combining a first output signal from the main amplifier with a second output signal from the cascaded first peaking amplifier and second peaking amplifier, and providing the combined output signal for wireless transmission. For example, the combined output signal may be routed to an antenna of a wireless device.

As described above, the improved-efficiency Doherty amplifier 500 can increase amplifier efficiency in power back-off operation. The inventor has also recognized and appreciated that bandwidth performance of the Doherty amplifier 500 can be improved. For example and referring to FIG. 5, there is a cost in bandwidth performance of a Doherty amplifier 500 when impedance-matching components 142, 144 are placed between the outputs of the main and peaking amplifiers 132, 138 and the impedance inverter 150 and combining node 155. At these locations, the impedance-matching components 142, 144 add electrical path length between the two amplifiers so that it may not be possible for the impedance inverter 150 to employ only a 90-degree rotation to compensate for the phase rotation introduced by the 90° coupler. Because of the added electrical path, the impedance inverter 150 may operate with a phase rotation θ that is an odd integer multiple of 90 degrees according to the following relation $$\theta \sim (2n+1)90°$$ EQ. 1 where n is an integer value of 1 or greater. For example, when the impedance-matching elements 142, 144 are located before the impedance inverter 150 and combining node 155, the minimum allowable phase rotation by the impedance inverter 150 may be 270° (n=1) due to the extra electrical path length added by the impedance-matching elements.

To investigate the cost in bandwidth performance of a Doherty amplifier 500 due to the impedance-matching elements 142, 144, high-frequency simulations were performed using a low-power circuit model. The low-power circuit model represents a case when the peaking amplifier is off. In the low-power circuit model, the main amplifier 132 is represented as a first current source $I_m$ and the peaking amplifier 138 is represented as a second current source $I_p$, which outputs no current. The impedance inverter 150 is modeled as a transmission line having a resistance $R_o$ and having an adjustable phase rotation, which can be set to an odd multiple of 90° at the center frequency of operation (2 GHz for this simulation). The load impedance is $R_o/2$. For purposes of the simulation, the impedance of the peaking amplifier when off is given a value of $20R_o$. The high-frequency simulations were carried out to assess the amplifier's RF fractional bandwidth. For purposes of evaluating amplifier performance, an RF fractional bandwidth ($\Delta\omega/\omega_o$) for the amplifier may be determined from a frequency difference $\Delta\omega$ between the −20 dB points on the frequency-response curves where the value of the back-reflected signal is at least 20 dB below an input signal level. Simulations of circuits and circuit elements described herein may be implemented using a software tool such as Advanced Design System (ADS) available from Keysight Technologies, Inc. of Santa Rosa, Calif. Other suitable software tools include, but are not limited to NI AWR Design Environment available from AWR Corporation of El Segundo, Calif. and Sonnet® software tools available from Sonnet Software of North Syracuse, N.Y.

The inventor has recognized and appreciated that when the peaking amplifier is off, a substantial impedance mismatch can occur between the output of the main amplifier 132 and the combining node 155 in the Doherty amplifier. Accordingly, the low-power operation may constrain the rated RF fractional bandwidth for a Doherty amplifier, e.g., a guaranteed bandwidth for all signal levels. Results from low-power simulations of a Doherty amplifier having impedance-matching elements 142, 144 located before the combining node 155 (n=1 in EQ. 1), show an RF fractional bandwidth at the impedance inverter 150 of approximately 6%. If the added electrical path introduced by the impedance-matching elements 142, 144 is greater, the minimum allowable phase introduced by the impedance inverter 150 may increase to 450° (n=2), which results in an RF fractional bandwidth of about 3%. On the other hand, if the minimum allowable phase introduced by the impedance inverter 150 were 90°, then the RF fractional bandwidth could increase to over 17%.

The inventor has recognized and appreciated that removing the impedance-matching elements 142, 144 before the impedance inverter 150 and combining node 155 allows a reduction in the compensating phase introduced by the impedance inverter to 90° or approximately 90°. Although the compensating phase angle is preferably 90°, in some cases the coupler 110 may impart a phase difference between 85° and 95°, which is compensated by the impedance inverter.

Figure 8:
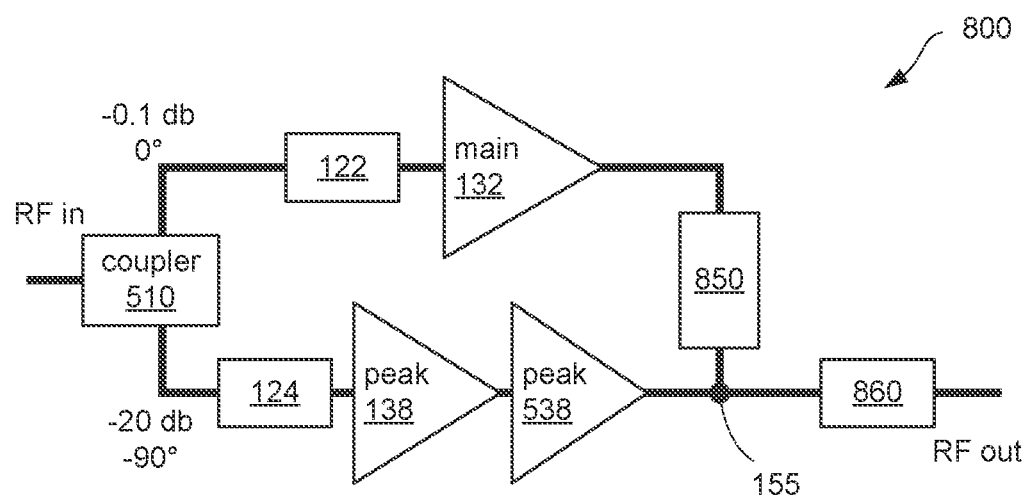
FIG. 8 depicts an improved-efficiency Doherty amplifier, according to some embodiments.

FIG. 8 depicts an embodiment of a high-efficiency Doherty amplifier 800 in which signals from the main and peaking amplifiers are combined first, and then impedance is matched to a load after combining. For example, impedance matching can be accomplished in an output impedance-matching element 860 located after the combining node 155. According to some embodiments, the combining node 155 may be located at the output of the peaking amplifier 138. An input to an impedance inverter 850 may connect directly to an output from the main amplifier 132. There may be no impedance-matching element that matches or rotates the impedance from the main amplifier to 50 ohms, for example, between the output from the main amplifier and an input to the impedance inverter 850. Further, there may be no impedance-matching element between the output of the peaking amplifier 138 and the combining node 155.

Figure 9A:
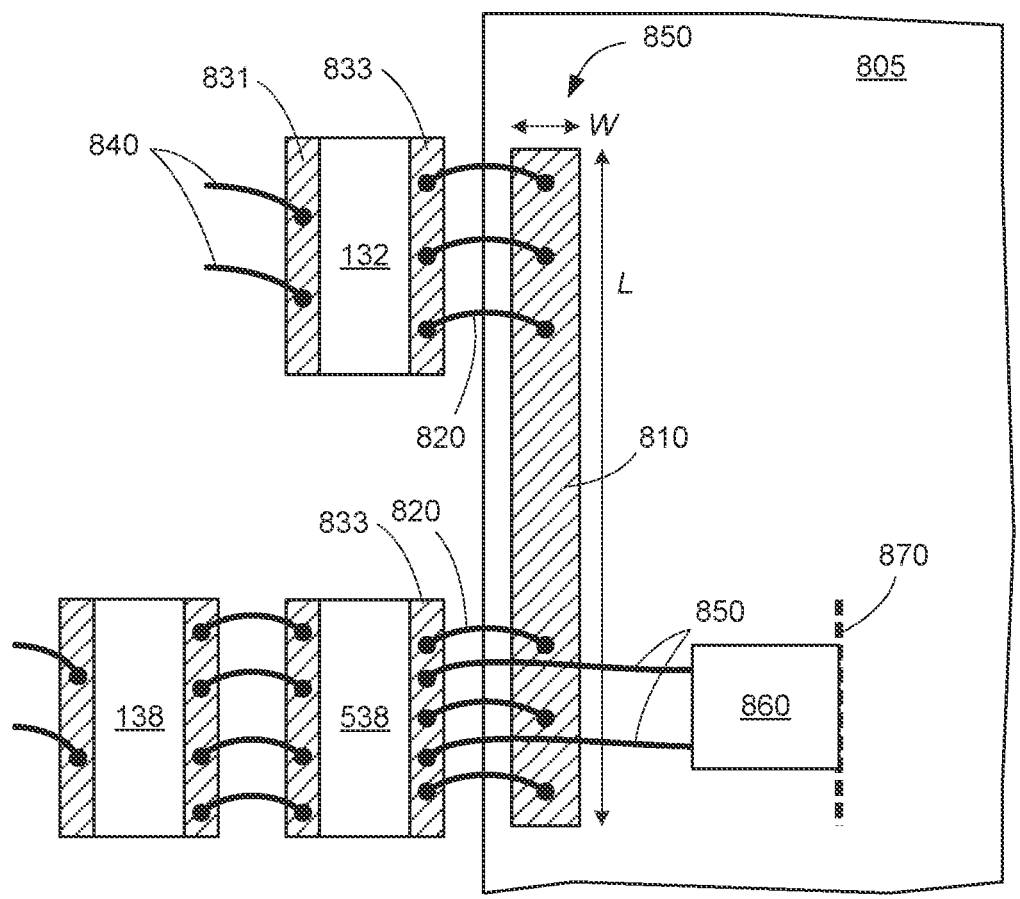
FIG. 9A depicts elements of an impedance inverter that includes lumped and integrated distributed inductance, according to some embodiments.

Further details of an impedance inverter 850 and modified Doherty amplifier 800 are depicted in FIG. 9A, according to some embodiments. In some cases, the impedance inverter 850 comprises a conductive strip line 810 (e.g., a microstrip line) that extends a length L. The length L may extend between and along output drain bonding pads 833 of the main amplifier 132 and the peaking amplifier 138. The conductive strip line 810 may have a width W. The length of the conductive strip line may be between approximately 2 millimeters and approximately 6 millimeters, according to some embodiments, and may be selected to provide a desired inductance for the strip line 810. The width of the conductive strip line may be between approximately 100 microns and approximately 1000 microns, according to some embodiments, and may be selected to provide a desired inductance for the strip line. In some implementations, the conductive strip line is formed over a ground conductor or ground plane and separated from the ground conductor or ground plane by a dielectric material (not shown). In other embodiments, the conductive strip line may not be formed over or adjacent to a ground plane. Instead, a ground plane may be removed from an area of a PCB at which the conductive strip line is patterned. The conductive strip line, when implemented in the impedance inverter for RF signals, may comprise an integrated distributed impedance element which is essentially entirely inductive. In some implementations, the strip line may include some parasitic capacitance and resistance.

The conductive strip line may be formed on a substrate 805, upon which an output impedance matching element 560 may be manufactured. In some embodiments, the main amplifier 132 and the peaking amplifier 138 may be mounted adjacent to the substrate 805 and be on one or more separate dies. In some implementations, the conductive strip line 810 may be integrated onto a same substrate on which the main amplifier 132 and/or the peaking amplifier 138 are formed. The substrate 805 on which the conductive strip line is formed may comprise a printed circuit board in some embodiments, a high-frequency laminate capable of carrying signals at GHz frequencies in some embodiments, a ceramic, or a semiconductor. An example of a high-frequency laminate is laminate model RO4003® available from Rogers Corporation of Chandler, Ariz.

According to some embodiments, an impedance inverter 850 may further include one or more amplifier output bond wires 820 that connect to a drain bond pad 833 of the main amplifier and the conductive strip line 810 near a first end of the strip line (e.g., located within about a first ⅓ of the length of the strip line). Additionally, there may be one or more amplifier output bond wires 820 connected between a drain bond pad of the peaking amplifier 138 and an opposing end of the conductive strip line 810. The output bond wires 820 may be arranged at essentially uniform spacing along the strip line in some embodiments, but may be arranged non-uniformly in other embodiments. The spacing between the bond wires may be between approximately 100 microns and approximately 800 microns. The bond wires 820 may be comprise gold or any other suitable conductor, may have a diameter between 20 microns and 80 microns, and may arc or extend over the substrate 805 and substrate 803 to a height between approximately 50 microns and approximately 250 microns. The output bond wires 820 comprise lumped inductive elements of the impedance inverter 850. Such bond wires are recognized in the field of RF electronics as "lumped inductors" having an inductance that is determined primarily by a length and diameter of the bond wire. There may be amplifier input bond wires 840 connecting to gate bond pads 831 of the main amplifier 132 and the peaking amplifier 138.

In some embodiments where the conductive strip line 810, main amplifier and/or peaking amplifier are integrated onto a same substrate, bond wires 820 may not be used. Instead, conductive interconnects such a microstrip transmission lines or conductive traces may be used to connect the strip line 810 to outputs from the main and peaking amplifiers. In some implementations where the conductive strip line 810, main amplifier and/or peaking amplifier are integrated onto a same substrate, one or both drain bond pads 833 may be replaced with or subsumed into the conductive strip line 810, so that the inductance of the impedance inverter is essentially entirely a distributed inductance.

For the embodiment depicted in FIG. 9A, a combining node of the Doherty amplifier 800 may be located at the drain bond pad 833 of the peaking amplifier 138. In such embodiments, the impedance inverter 850 may comprise lumped inductive elements (for example, the main and peaking amplifier output bond wires 820) and an integrated distributed inductive element comprising the conductive strip line 810. For purposes of analyzing RF performance, the impedance inverter may include lumped capacitive elements, which may include the drain-to source capacitances of the main amplifier 132 and the peaking amplifier 138 and capacitance of the drain bond pads 833. The impedance inverter 850 may further include a small distributed capacitance of the conductive strip line 810.

In some implementations, lumped capacitance elements may be added as shunts to the drain bond pads 833 and/or inductive strip line 810 to adjust an operating frequency of the Doherty amplifier to a desired value, or added in series to extend a length of the impedance inverter for higher power applications. In some cases, an integrated, inductive strip line may comprise two separated strip lines 812 that are connected by a capacitor 880 (e.g., a surface mount capacitor) added in series between the two halves of the strip line, as depicted in FIG. 9C. This arrangement of two strip lines can extend the overall distance between the two amplifiers, allowing larger amplifiers 132, 138 and higher power capability, without adding more inductance. However, the added capacitance should be limited to avoid altering phase rotation in the impedance inverter beyond 95 degrees.

In some cases, there may be output bond wires 850 connected between a drain bond pad 833 of the peaking amplifier 138 and an output impedance-matching element 860 of the Doherty amplifier. The output impedance-matching element 860 may comprise lumped and/or distributed impedance elements that are used to match an impedance from the drain bond pad 833 of the peaking amplifier 138 to a load impedance (e.g., 50 ohms) at a load plane 870.

Figure 9B:
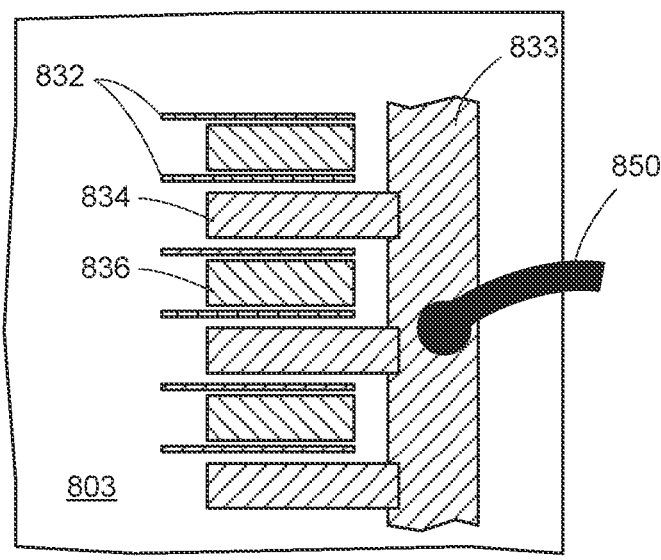
FIG. 9B depicts elements of a power amplifier, according to some embodiments.
Figure 9C:
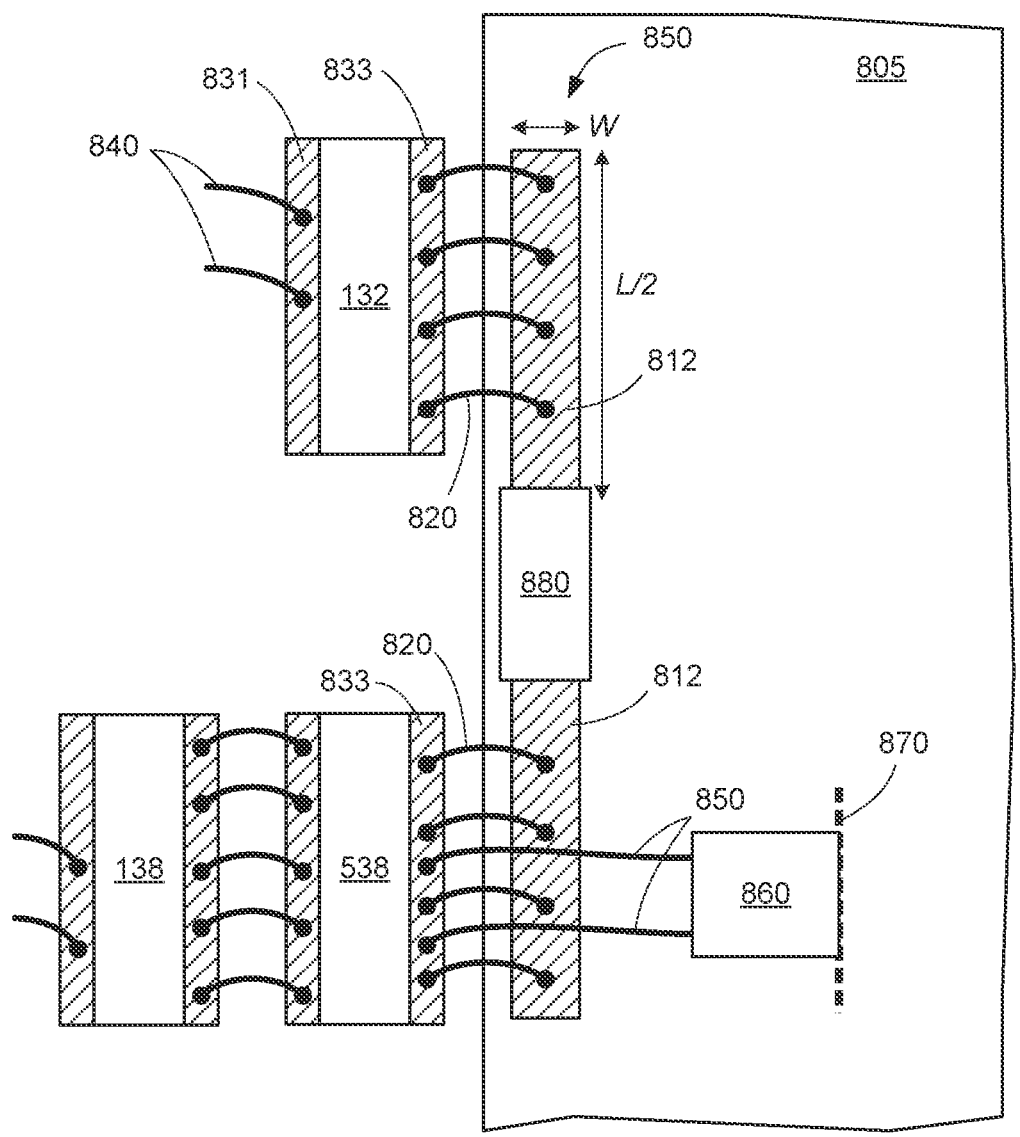
FIG. 9C depicts elements of an impedance inverter that includes lumped and integrated distributed inductance and lumped capacitance, according to some embodiments.

Additional details of structure near the drain bond pads 833 of the main or peaking amplifier are shown in FIG. 9B, for some embodiments. The main amplifier 132 and/or the peaking amplifiers 138, 538 may comprise a linear array of transistors having gate conductors 832, drain contacts 834, and source contacts 836 formed on a semiconductor substrate 803. The drain contacts 834 for an amplifier may connect to a drain bond pad 833, at which one or more output bond wires 820, 850 may be bonded. In some implementations, the active regions of the transistors may comprise gallium nitride, which is desirable for high-power, high-frequency amplification of RF signals as described above. As used herein, the phrase "gallium nitride" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosporide nitride ($GaAs_xP_yN_{(1-x-y)}$), aluminum indium gallium arsenide phosporide nitride ($Al_xIn_yGa_{(1-x-y)}As_aP_bN_{(1-a-b)}$), amongst others. In some cases, the transistors may be formed from other semiconductor materials such as gallium arsenide, silicon carbide, silicon germanium, silicon, indium phosphide, etc. and the invention is not limited to gallium-nitride-based amplifiers.

A benefit of a conductive strip line 810 in the impedance inverter as an inductive impedance element is that it can more readily allow for scalability of power of the Doherty amplifier 800 compared to lumped inductive elements only. For example, the power-handling capability of a Doherty amplifier may be determined by the size of transistors in the main amplifier 132 and peaking amplifier 138. Power may be increased in a Doherty amplifier by increasing the number of transistors (gate conductors, drain contacts, and source contacts) along the linear array of transistors in the main amplifier and the peaking amplifier. However, increasing the number of transistors and length of the arrays can require additional amplifier output bond wires 820 between the two amplifiers and corresponding locations on the conductive strip line 810, and may require increasing the length of the strip line.

The addition of amplifier output bond wires 820 and increased length of the strip line would normally increase the inductance of the impedance inverter 850. The inventor has recognized and appreciated that this increase in inductance may be offset by decreasing the inductance of the conductive strip line 810. Inductance of the strip line 810 may be decreased by increasing its width W. By selecting the length and width of the strip line, the distributed inductance of the strip line 810 may be tuned to a desired value. According to some embodiments, a total of the distributed inductance of the strip line may be between approximately 250 picoHenries and approximately 1.5 nanoHenries.

For power scaling in some cases, the inductance of the strip line 810 may be decreased by increasing its width W and/or decreasing its length L. Conversely, the inductance of the strip line may be increased by decreasing its width W and/or increasing its length L. Such changes will also affect any capacitance and resistance of the strip line. According to some embodiments, the conductive strip line 810 comprises a tunable impedance element for the impedance inverter 850 that may be adjusted at the patterning stage of manufacture for a desired application. Accordingly, power of the Doherty amplifier 800 may be scaled while preserving an operating frequency and bandwidth performance of the Doherty amplifier 800. Such scalability would not be possible in a purely lumped-element impedance inverter where the drain bond pad 833 of the main amplifier 132 is wire bonded directly to the drain bond pad of the peaking amplifier 138.

Adding length to the transistor arrays may also add electrical path length to the impedance inverter 850. As a result, there will be a limit to the total allowed electrical path length, and consequently power, that the Doherty amplifier 800 can handle when arranged as depicted in FIG. 9A. Essentially, the electrical path length can be increased until the phase rotation reaches approximately 90 degrees, though higher values (e.g., up to 95 degrees) may be possible in some cases where the coupler 510 provides a higher phase rotation than 90 degrees. Because the phase rotation for a physical path length will depend on frequency, lower-frequency devices may allow greater length extensions of the amplifier transistor arrays and therefore handle high powers. Initial calculations indicate that Doherty amplifiers configured as shown in FIG. 9A should be capable of amplifying RF signals in frequency ranges between about 500 MHz and about 6 GHz to power levels between about 5 Watts and about 100 Watts at 500 MHz and between about 5 Watts and about 35 Watts at 6 GHz. In some implementations, the rated output power levels can be as high as between about 20 Watts and about 100 Watts at 500 MHz and between about 20 Watts and about 35 Watts at 6 GHz.

In an alternative embodiment, the power capability of the Doherty amplifier 800 may be doubled. Referring again to FIG. 9A, a second main amplifier 132 may be located on a side of the conductive strip line opposite the illustrated first main amplifier 132. The output impedance-matching element 860 may be rotated 90 degrees and mounted near the end of the conductive strip line 810 by the peaking amplifier 138. A second peaking amplifier 138 may be located on a side of the conductive strip line opposite the illustrated first peaking amplifier 138. Drain bond pads from the additional main and peaking amplifiers may be wire bonded to the conductive strip line. Additional bond wires may be connected at angles from the output impedance-matching element 860 to drain bond pads of the peaking amplifiers 138.

In some embodiments, the values of a Doherty amplifier's operating frequency $\omega_o$ and inductance $L_s$ of the strip line 810 are constrained in part by amplifier design. For example, an amplifier design may have a drain-to-source capacitance $C_{ds}$, and be rated at a maximum drain-to-source current $I_{max}$ for an operating voltage $V_{ds}$. The resistance $R_o$ at which maximum power may be transferred from the amplifier may be determined approximately from the following relation.

$$R_o \approx 2(V_{ds}-V_k)/I_{max} \quad (EQ. 2)$$

where $V_k$ is the knee voltage for the amplifier. Once $R_o$ is estimated, then it is desirable to have the admittance of the shunt capacitance $C_{sh}$ (primarily determined by $C_{ds}$, though it may include drain pad capacitance and any added capacitance) and the impedance of the impedance inverter's inductance $L_c$ (determined from the bond wires 820 and strip line 810) match the corresponding admittance and impedance values of $R_o$, which yields:

$$R_o \approx 1/C_{sh}\omega_o \quad (EQ. 3)$$

$$R_o \approx \omega_o L_c \quad (EQ. 4)$$

Since $C_{ds}$ is primarily determined by the amplifiers' design and may be the dominant capacitance, EQ. 3 roughly constrains the operating frequency of the amplifier, though it may be tuned downward by adding additional shunt capacitance. According to some embodiments, when the operating frequency is selected, the conductive strip line may be designed to provide inductance according to EQ. 4.

Figure 10:
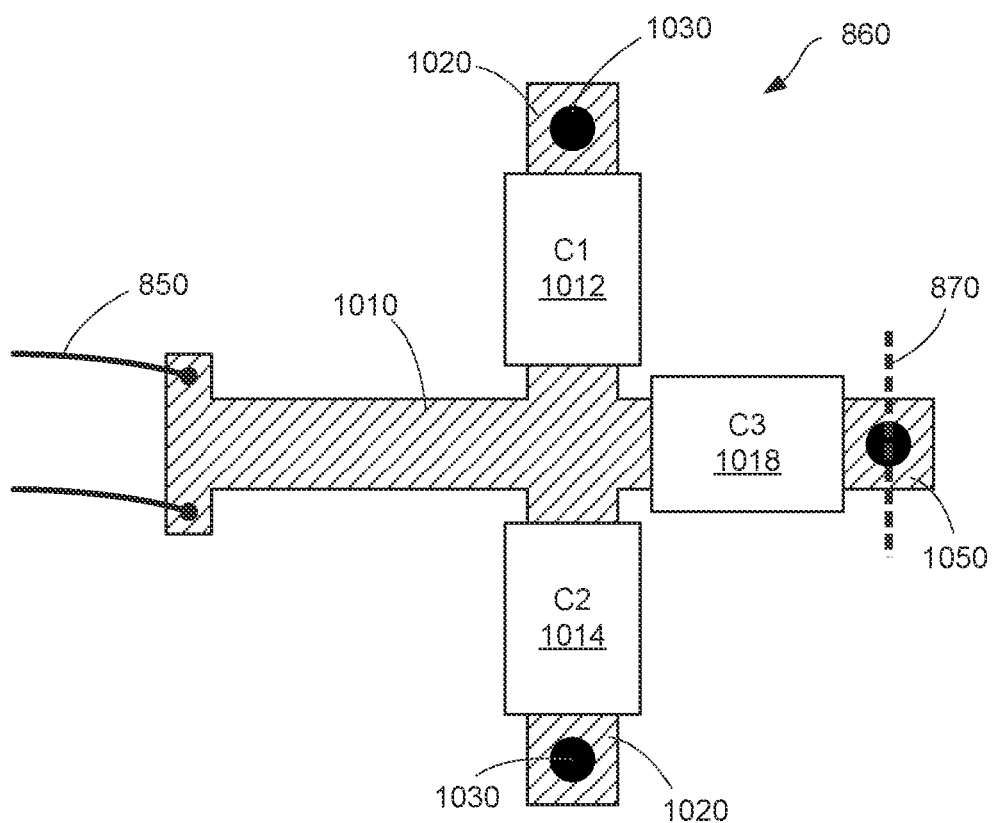
FIG. 10 depicts an impedance-matching element at an output of a modified Doherty amplifier, according to some embodiments.

In an actual amplifier, impedance at the output of the impedance inverter 850 may need to be matched to impedance of a load (e.g., 50 ohms). One example of an output impedance-matching element 860 is depicted in FIG. 10, but the depicted element is only one example of an output-impedance matching element and the invention is not limited to only this configuration. Other embodiments may be used for the output-impedance-matching element in other implementations. According to some embodiments, output bond wires 850 may be bonded to an output strip line 1010 of the output impedance-matching element 860. Shunt capacitors 1012, 1014 may connect between the output strip line 1010 and pads 1020, which are connected to an underlying ground conductor using a via and shunt conductor 1030. An output capacitor 1018 may connect between the output strip line 1010 and an output bonding pad 1150. The output bonding pad 1150 may connect to a load of 50 Ohms, for example. The length and width of the output strip line 1010, the values of the shunt capacitors 1012, 1014, and the value of the output capacitor 1018 may be selected to match an impedance from the combining node to an impedance at the load plane 870. Using an impedance-matching element of the type depicted in FIG. 10 may allow the amplifier to drive a load at 3.5 GHz with an RF fractional bandwidth of approximately 200 MHz or about 6%. Even with this reduction, the RF fractional bandwidth for the Doherty amplifier 800 is nearly twice the bandwidth of a conventional Doherty amplifier. If impedance-matching to a load is not done well, or has a narrow RF fractional bandwidth, then the overall bandwidth of the device may be limited by the output impedance-matching element 860.

Figure 11:
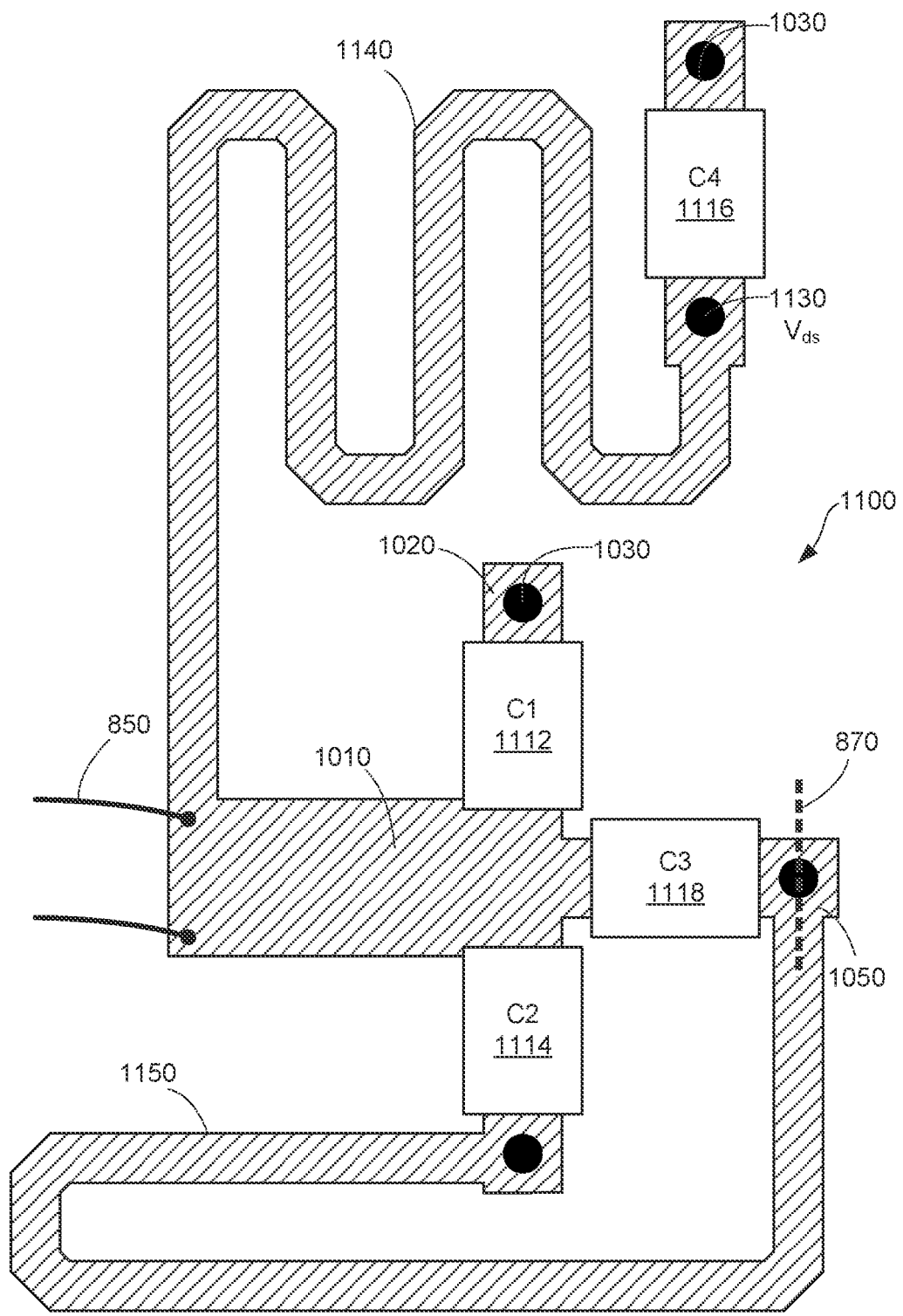
FIG. 11 depicts a double-section impedance-matching element at an output of a modified Doherty amplifier, according to some embodiments.

To obtain a broader bandwidth, a double-section output impedance-matching element 1100 may be used, as depicted in FIG. 11. A double-section impedance-matching element may comprise an added inductive strip line 1150 that connects to the output bonding pad 1150 and to capacitive shunt 1114. The dimensions of the strip line 1010 may be resized to provide a desired inductance for the first section.

Some embodiments may include transistor biasing components comprising an inductive strip line 1140 that connects to a DC biasing port 1130, at which voltage for biasing drains of transistors in the amplifiers 132, 138 may be applied. A shunt capacitor 1216 may be connected to the biasing port 1130. When installed in a device, an additional capacitor may be mounted external to the board on which the impedance-matching element 1100 is formed and arranged in parallel to the shunt capacitor 1216. The external capacitor may have a value between 2 microFarads and 50 microFarads. The double-section impedance-matching element 1100 can improve impedance matching over a range of RF frequencies near the center or carrier frequency, as compared to the single section impedance-matching element depicted in FIG. 10. Therefore, the double-section impedance-matching element 1100 can remove a bandwidth bottleneck associated with the single section impedance-matching element 860 and allow an RF fractional bandwidth of approximately 18%.

In some implementations, additional impedance-matching sections may be included between the impedance inverter 850 and load. Whether comprising one or more sections, an output impedance-matching element preferably transforms the impedance at the combining node 155 to match or approximately match the impedance at the load plane 870 over a bandwidth of interest (e.g., 80 MHz, 100 MHz, 200 Mhz, 400 MHz, or any desired RF fractional bandwidth in this range) at the carrier frequency (e.g., 3.5 GHz in the above example, though other carrier frequencies may be used).

Methods for operating a Doherty amplifier according to the circuit shown in FIG. 8 are also contemplated. In some implementations, a method for operating a Doherty amplifier 800 may comprise acts of splitting a received signal into a first signal and a second signal having a first phase with respect to the first signal, amplifying the first signal with a main amplifier 132, and amplifying the second signal with first peaking amplifier 138 and second peaking amplifier 538. A method embodiment may further comprise providing an output from the main amplifier directly to an input of an impedance inverter 850, wherein the impedance inverter comprises an integrated distributed inductor, and introducing a second phase with the impedance inverter that compensates for the first phase. In some implementations, a method for operating a Doherty amplifier may further comprise combining an output from the impedance inverter 850 with an output from the second peaking amplifier 538 to produce a combined output, and providing the combined output to an impedance-matching element 860 that matches the output impedance to the impedance of a load. The load impedance may have a value of 50 ohms or approximately 50 ohms. In some implementations, the load impedance may have a value between approximately 25 ohms and approximately 100 ohms. Operation of a Doherty amplifier 800 may further comprise providing the combined output for transmission by a cellular base station.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

The invention claimed is:

1. A Doherty amplifier comprising:
an RF coupler;
a main amplifier coupled to a first port of the RF coupler;
a two-stage peaking amplifier coupled to a second port of the RF coupler, wherein the two-stage peaking amplifier is biased to delay a transition from an off to an on state to within at least 6 dB of a power compression point of the main amplifier; and
a combining node coupled to an output port from the main amplifier and an output port from the two-stage peaking amplifier.

2. The Doherty amplifier of claim 1, wherein:
the two-stage peaking amplifier comprises two cascaded amplifiers; and
a gain value for each peaking amplifier in the two-stage peaking amplifier is the same to within 3 dB.

3. The Doherty amplifier of claim 1, wherein the two-stage peaking amplifier comprises two cascaded amplifiers of a same design.

4. The Doherty amplifier of claim 3, wherein the two cascaded amplifiers comprise gallium-nitride transistors.

5. The Doherty amplifier of claim 2, wherein each peaking amplifier in the two-stage peaking amplifier has a gain value between 16 dB and 30 dB.

6. The Doherty amplifier of claim 1, wherein there are no impedance-matching elements between the output port from the main amplifier and the combining node that match an impedance to 50 Ohms.

7. The Doherty amplifier of claim 1, wherein there are no impedance-matching elements between the output port from the two-stage peaking amplifier and the combining node that match an impedance to 50 Ohms.

8. The Doherty amplifier of claim 1, wherein the combining node is located at a drain pad of a second peaking amplifier of the two-stage peaking amplifier.

9. The Doherty amplifier of claim 1, wherein the RF coupler is configured to divide a received RF signal into a first signal for the main amplifier and a second signal for the two-stage peaking amplifier, wherein the first signal has at least twice as much power as the second signal.

10. The Doherty amplifier of claim 9, wherein a difference in power between the first signal and the second signal is between 10 dB and 50 dB.

11. A Doherty amplifier comprising:
a main amplifier;
a two-stage peaking amplifier; and
a combining node coupled to an output port from the main amplifier and an output port from the two-stage peaking amplifier, wherein:
the two-stage peaking amplifier is biased to delay a transition from an off to an on state to within at least 6 dB of a power compression point of the main amplifier; and
there are no impedance-matching elements between an output of the main amplifier and the combining node that match an impedance to 50 Ohms.

12. The Doherty amplifier of claim 11, wherein there are no impedance-matching elements between an output of the two-stage peaking amplifier and the combining node that match an impedance to 50 Ohms.

13. The Doherty amplifier of claim 11, further comprising an RF coupler configured to divide a received RF signal into a first signal for the main amplifier and a second signal for the two-stage peaking amplifier, wherein the first signal has at least twice as much power as the second signal.

14. The Doherty amplifier of claim 11, wherein the combining node is located at a drain pad of a second peaking amplifier of the two-stage peaking amplifier.

15. The Doherty amplifier of claim 11, wherein the two-stage peaking amplifier comprises two cascaded gallium-nitride amplifiers of a same design.

16. A method of amplifying signals with a Doherty amplifier, the method comprising:
receiving, at a coupler, a signal;
dividing the signal with the coupler into a first signal and a second signal;
providing the first signal to a main amplifier in a first circuit branch;
amplifying the first signal with the main amplifier;
providing the second signal to a first peaking amplifier cascaded with a second peaking amplifier in a second circuit branch, wherein the first peaking amplifier and the second peaking amplifier are biased to delay a transition from an off to an on state to within at least 6 dB of a power compression point of the main amplifier;
amplifying the second signal with the first peaking amplifier and second peaking amplifier; and
combining a first output signal from the first circuit branch with a second output signal from the second circuit branch.

17. The method of claim 16, wherein dividing the signal comprises providing at least twice as much power to the first signal than to the second signal.

18. The method of claim 16, wherein combining the first output signal with the second output signal comprises providing the first output signal to a drain pad of the second peaking amplifier.

19. The method of claim 16, further comprising compensating, in the first circuit branch, for a signal delay introduced by the second peaking amplifier.

20. The method of claim 16, wherein amplifying the second signal comprises:
amplifying the second signal by a first amount with the first peaking amplifier; and
amplifying an output from the first peaking amplifier by a second amount with the second peaking amplifier, wherein the same to within 3 dB.

* * * * *